United States Patent [19]

Itaba et al.

[11] 4,450,205

[45] May 22, 1984

[54] SURFACE-COATED BLADE MEMBER OF SUPER HARD ALLOY FOR CUTTING TOOLS AND PROCESS FOR PRODUCING SAME

[75] Inventors: Takeshi Itaba; Shotaro Matsumoto; Takeshi Abe, all of Tokyo, Japan

[73] Assignee: Mitsubishi Kinzoku Kabushiki Kaisha, Tokyo, Japan

[21] Appl. No.: 399,802

[22] Filed: Jul. 19, 1982

Related U.S. Application Data

[63] Continuation of Ser. No. 192,628, Sep. 30, 1980, abandoned.

[30] Foreign Application Priority Data

Oct. 26, 1979 [JP] Japan .................................. 54-138572

[51] Int. Cl.³ .................... B32B 15/04; C23C 11/08; C23C 13/02; C23C 13/04
[52] U.S. Cl. .................................. 428/552; 427/250; 427/255.2; 427/255.3; 427/255.7; 428/553; 428/564; 428/627
[58] Field of Search ............... 428/628, 629, 623, 627, 428/660, 681–685, 554, 556, 558, 562, 563, 552; 75/238, 242; 427/248.1–253, 404, 405, 429.1–429.7, 255.2, 255.3, 255.7

[56] References Cited

U.S. PATENT DOCUMENTS

| | | | |
|---|---|---|---|
| 3,684,585 | 8/1972 | Stroup et al. | 148/31.5 |
| 3,874,900 | 4/1975 | Post et al. | 148/31.5 |
| 4,226,082 | 10/1980 | Nishida | 428/627 |
| 4,239,536 | 12/1980 | Yamamoto et al. | 75/238 |
| 4,337,300 | 6/1982 | Itaba et al. | 428/627 |

FOREIGN PATENT DOCUMENTS

| | | | |
|---|---|---|---|
| 2528255 | 2/1906 | Fed. Rep. of Germany | 427/255.7 |
| 50-102508 | 8/1975 | Japan | 75/238 |

*Primary Examiner*—Michael L. Lewis
*Attorney, Agent, or Firm*—Cushman, Darby & Cushman

[57] ABSTRACT

A surface-coated blade member for cutting tools comprises a metal substrate of a super hard alloy and a coating on at least one surface of said substrate, said coating being composed of a layer of vapor deposited titanium on the surface of said metal substrate and at least one layer of vapor deposited titanium compound on said layer of titanium, and said layer of titanium compound being selected from the group consisting of titanium carbide, titanium nitride, titanium carbo-nitride, titanium oxy-carbide and titanium oxy-carbo-nitride, said layer of titanium being no larger than 2 μm thick and said layer of titanium compound being 0.5 to 10 μm thick.

6 Claims, No Drawings

SURFACE-COATED BLADE MEMBER OF SUPER HARD ALLOY FOR CUTTING TOOLS AND PROCESS FOR PRODUCING SAME

CROSS-REFERENCE TO RELATED APPLICATION

This is a continuation of our earlier application Ser. No. 192,628 filed Sept. 30, 1980, now abandoned.

BACKGROUND OF THE INVENTION

1. Field of the Invention

This invention relates to a surface-coated blade member or insert adapted to be secured to a body of a cutting tool by brazing or other suitable fastening means. The blade member comprises a metal substrate of a super hard alloy on which a hard coating is formed by vapor deposition.

2. Prior Art

It is known from Japanese Patent Application No. 52-130488 to provide a surface-coated blade member under consideration which comprises a metal substrate of a super hard alloy, and a hard coating on the surface of the substrate, said coating being composed of at least one layer of vapor deposited titanium compound on the surface of the substrate, and the titanium compound being selected from the group consisting of titanium carbide (TiC), titanium nitride (TiN), titanium carbonitride (TiCN), titanium oxy-carbide (TiCO), and titanium oxy-carbo-nitride (TiCNO). The layer of titanium compound is 0.5 to 10 μm thick.

This conventional blade member has been found not satisfactory in that the strength of bonding between the coating and the substrate is not so high that this titanium compound coating is susceptible to separation from the substrate surface when the blade member is used to carry out a cutting operation. This difficulty arises from the fact that atoms of the constituents of the substrate fail to positively combine with atoms of titanium contained in the coating since atoms of carbon, nitrogen and oxygen contained in the coating lower activity in the surface of the substrate.

If a titanium compound is deposited on the substrate to form a coating of the type described at elevated temperatures, the bonding between the coating and the substrate is enhanced since the diffusion of atoms between the substrate and the coating takes place sufficiently to promote the combination of the atoms. However, this procedure is not practical because the metal substrate becomes deteriorated by the high temperatures used. More specifically, the properties of the substrate becomes changed because the metal atoms of the substrate are diffused into the coating. Further, since the metal substrate is made of a super hard alloy, a brittle layer is formed on the surface of the substrate to lower its toughness.

U.S. Pat. No. 3,874,900 discloses a coating method in which a coating is applied to a metal substrate by chemical vapor deposition. The coating comprises a layer of titanium carbide and a layer of titanium nitride. In forming the titanium carbide layer, an interlayer of carbon, titanium, titanium carbide and metal of the substrate is formed between the substrate and the titanium carbide layer. This method has also been found not satisfactory in that the metal substrate is diffused into the coating because the chemical vapor deposition is carried out at high temperatures of 900° C. to 1200° C. As a result, the properties of the substrate become changed.

SUMMARY OF THE INVENTION

It is therefore an object of this invention to provide a surface-coated blade member for cutting tools in which the bonding of a hard coating to a substrate of a super hard alloy is highly enhanced to provide a high wear resistance.

Another object is to provide a process for producing such a blade member.

According to a first aspect of the present invention, there is provided a surface-coated blade member for cutting tools which comprises a metal substrate and a coating on at least one surface of said substrate, said coating being composed of a layer of vapor deposited titanium on the surface of said metal substrate and at least one layer of vapor deposited titanium compound on said layer of titanium, and said layer of titanium compound being selected from the group consisting of titanium carbide, titanium nitride, titanium carbonitride, titanium oxy-carbide and titanium oxy-carbonitride, said layer of titanium being no larger than 2 μm and said layer of titanium compound being 0.5 to 10 μm thick.

With this structure, the strength of bonding between the metal substrate and the layer of titanium is high, and also the strength of bonding between the layer of titanium and the layer of titanium compound is high. Thus, the bonding of the hard coating, i.e., the layer of titanium compound to the metal substrate is highly enhanced through the intermediary of the layer of titanium interposed therebetween. The reason why the strength of bonding between the metal substrate and the layer of titanium is high is that titanium atoms are quite active and that the substrate is not subjected at its surface to nonmetal atoms which lower the activity in the substrate surface, such nonmetal atoms being diffused and dissolved in the titanium layer. Therefore, the titanium atoms positively combine with the metal atoms of the substrate. Also, the reason why the strength of bonding between the layer of titanium and the layer of titanium compound is high is that the titanium atoms are quite active and that these two layers have common metal atoms, that is, titanium atoms.

The thickness of the layer of titanium is no larger than 2 μm. If the thickness exceeds this value, the overall coating becomes less hard and has a lowered wear resistance. This will shorten a service life of the blade member. Particularly, in the case of the titanium layer having a thickness not exceeding 0.9 μm, the blade member exhibits a marked wear resistance. The layer of titanium compound is 0.5 to 10 μm thick. If the thickness is less than 0.5 μm, the coating fails to have a desired wear resistance. On the other hand, if the thickness exceeds 10 μm, the coating become brittle and less tough.

Another advantage of the provision of the layer of titanium is that this layer is capable of absorbing the stresses exerted on the blade member during a cutting operation. During the cutting operation, the blade member is subjected to substantial stresses. In the absence of such titanium layer, the hard coating, i.e., the layer of titanium compound is susceptible to stress cracking and subsequent separation from the metal substrate during the cutting operation because the hard coating does not have deformability and therefore fails to follow the deformation of the substrate. The layer of titanium suitably absorbs such stresses and prevents the overall coating from being separated from the substrate.

According to a second aspect of the present invention, there is provided a process for producing a surface-coated blade member for cutting tools, which comprises the steps of:

placing a metal substrate in a vacuum chamber; vapor depositing no larger 2 μm thick layer of titanium on at least one surface of said substrate; and subsequently vapor depositing at least one layer of titanium compound on said layer of titanium to form a coating on said substrate, said layer of titanium compound being 0.5 to 10 μm thick, and said titanium compound being selected from the group consisting of titanium carbide, titanium nitride, titanium carbo-nitride, titanium oxy-carbide and titanium oxy-carbo-nitride.

With this method, the layer of titanium and the layer of titanium compound are successively formed by vapor deposition in the vacuum chamber. The layer of vapor deposited titanium should not be exposed to the atmosphere since the oxides of titanium are formed on this layer. This would adversely affect the strength of bonding between the layer of titanium and the subsequently vapor deposited layer of titanium compound.

During the vapor depositing operation, the metal substrate should preferably be maintained at temperatures of no less than 300° C. If the temperature of the substrate is below 300° C., the atoms of carbon, nitrogen and oxygen fail to be sufficiently diffused into the layer of titanium. As a result, residual such atoms lower the strength of bonding between the two layers.

The substrate made of a super hard alloy should preferably be maintained at temperatures below 800° C. Otherwise, a brittle layer would be formed on the surface of the substrate to lower its toughness.

Further, since the vapor deposition of the layers are carried out at relatively low temperatures, the metal atoms of the substrate will not be diffused into the coating so that the properties of the substrate are not changed.

The layer of titanium and the layer of titanium compound are formed either by a conventional physical vapor deposition process such as an ion plating process and a sputtering process or a chemical vapor deposition process such as one using a low temperature plasma.

Further, the super hard alloy constituting the metal substrate should contain 2 to 30% by weight at least one metal selected from the iron family. The titanium atoms of the layer of titanium combine positively with the atoms in the surface of the substrate and particularly with the metal atoms of the metal phase. For this reason, if the metal of the iron family is contained in the super hard alloy in an amount of less than 2% by weight, a sufficiently high bonding strength is not obtained. On the other hand, if the super hard alloy contains no less than 30% by weight of the metal of the iron family, the substrate is subjected to considerable deformation due to stresses during the cutting operation of the blade member so that the coating having a small deformability is susceptible to cracking and subsequent separation from the substrate even though the strength of bonding therebetween is high.

DESCRIPTION OF THE INVENTION

The invention will now be illustrated by the following examples.

EXAMPLE 1

There was prepared, as a substrate, a throw-away blade member made of a super hard alloy or cemented carbide containing WC, 5% by weigh Co and 5% by weight TiC and conforming in shape to a blade member of JIS.SNP432 (ISO.SNGN120408). There was used an ion plating apparatus of the type in which an electron beam was applied to a titanium block supported on a support means mounted within a vacuum chamber so that the vapored titanium and gases introduced into the vacuum chamber were allowed to pass through the plasma within the vacuum chamber. The above-mentioned blade member or substrate was first placed within the vacuum chamber. Then, 0.5 μm thick layer of titanium was vapor deposited on the surface of the substrate at a heat temperature of 750° C. in an argon atmosphere. Subsequently, 3.5 μm thick layer of titanium compound (TiCN) was vapor deposited on the layer of titanium by replacing the argon gas with a mixture gas of $N_2$, $C_2H_2$ and Ar to provide a surface coated blade member of the super hard alloy (hereinafter referred to as "the blade member of this invention").

For comparison purposes, a comparison blade member was prepared according to the above procedure except that the layer of titanium was not provided. Using the Rockwell hardness tester, a coating separation test was carried out in which a dent was applied under a load of 50 kg to the coateted surface of each of the two blade members, and the coating was observed to determine whether any separation of the coating from each substrate took place around the applied dent. The coating of the blade member of this invention was subjected to no separation and exhibited an excellent bonding strength. On the other hand, the coating of the comparison blade member was separated from the substrate around the applied dent.

A throw-away blade member of the super hard alloy identical to that of this invention but having no coating was also prepared. This blade member is hereinafter referred to as "the non-coating blade member".

The blade member of this invention, the comparison blade member and the non-coating blade member were each attached to a holder of JIS.N11R-44 to provide a cutting tool. These three cutting tools were used to turn a workpiece to determine how long it took for the flank of each blade member to be worn 0.3 mm. The cutting conditions for this turning test were as follows:

| Workpiece | a circular cross-section bar of alloyed steel (JIS · SNCM-8; AISI · 4340; Brinell hardness: 220) |
|---|---|
| Cutting speed | 120 m/minute |
| Feed rate | 0.2 mm/revolution |
| Depth of cut | 1 mm |
| Coolant | used |

The results obtained are given in Table 1 below.

TABLE 1

| Kind of blade member | Time of cutting (min.) | Results of separation test |
|---|---|---|
| Blade member of this invention | 100 | No separation developed |
| Comparison blade member | 30 | Separation developed |
| Non-coating blade member | 10 | — |

As can be seen from Table 1, the blade member of this invention exhibited a quite high bonding strength of the coating by virtue of the provision of the layer of titanium interposed between the substrate and the layer of titanium compound, and was subjected to no separation of the coating. The cutting time of the present blade member was substantially longer than those of the other two blade members, that is to say, more than three times that of the comparison blade member and ten times that of the non-coating blade member. Thus, the present blade member turned out to have an excellent cutting performance.

EXAMPLE 2

There were prepared as substrates various blade members having different constituents as shown in Table 2 below. A coating was applied by conventional vapor deposition processes to each of these substrates to provide the coated blade members (a) to (l) of this invention and the coated comparison blade members (a) to (h), as shown in Table 4. With a sputtering apparatus used, a target of titanium accommodated within a vacuum chamber was subjected to sputtering in a predetermined atmosphere. For example, TiCNO, a layer of titanium compound, was vapor deposited in an atmosphere of Ar, $N_2$, $CO_2$ and $C_2H_2$, TiC in an atmosphere of Ar and $C_2H_2$, and TiN in an atmosphere of Ar and $N_2$. The comparison blade member (a) had no layer of titanium in the coating. The comparison blade member (b) had the layer of titanium the thickness of which was beyond the upper limit of this invention. The comparison blade member (c) had the layer of titanium compound the thickness of which was beyond the upper limit of this invention. The comparison blade member (d) had the substrate containing not less than 30% by weight Co, and the comparison blade member (e) had the substrate containing 1% by weight Co. The comparison blade member (f) had the coating composed of the layer of titanium and the layer of titanium compound which were not successively formed in the same deposition chamber. The comparison blade member (g) had the coating temperature (the temperature of the substrate) of less than 300° C. The comparison blade member (h) had the coating temperature of more than 800° C.

The coating separation test and turning test of the above blade members were carried out according to the procedure of Example 1. The results obtained are given in Table 3 below.

TABLE 2

| Kind of coated blade member | | Constituents of substrate (% by weight) | Coating forming process | Coating temperature (Temperature of substrate) | Thickness of titanium-layer (μm) | Constituents and thickness of layer of titanium compound (μm) |
|---|---|---|---|---|---|---|
| Blade members of this invention | a | WC—10% Tic—10% Tac—5% Co | Ion plating process | 700° C. | 0.3 | TiCN: 3 μm |
| | b | " | Ion plating process | " | 1.0 | TiN: 2 μm—TiCNO: 5 μm |
| | c | " | Ion plating process | " | 1.5 | TiCO: 1 μm—TiC: 6 μm |
| | d | " | Plasma chemical vapor deposition process | " | 1.9 | TiN: 3 μm—TiC: 3 μm |
| | e | TiCN—10% Mo—10% Ni | Sputtering process | " | 1.0 | TiNo 5 μm |
| | f | WC—10% HfC—10% ZrC—10% Co | " | " | 0.9 | TiCN: 5 μm |
| | g | WC—10% NbC—10% TaC—10% Co | " | " | 0.9 | " |
| | g' | " | " | " | 0.7 | " |
| | g" | " | " | " | 0.3 | " |
| | g''' | " | " | " | 1.0 | " |
| | h | WC—10% TiCN—10% TaN—5% Co—5% Ni | " | " | 0.9 | " |
| | i | WC—10% TiC—10% Tac—30% Co | Plasma chemical vapor deposition process | " | 0.9 | " |
| | j | WC—10% TiC—10% TaC—2% Co | Plasma chemical vapor deposition process | " | 0.9 | " |
| | k | WC—10% TiC—10% TaC—5% Co | Ion plating process | 350° C. | 0.9 | " |
| | l | " | " | 750° C. | 0.9 | " |
| Comparison blade members | a | WC—10% TiC—10% TaC—5% Co | Ion plating process | 700° C. | — | TiCN: 3 μm |
| | b | " | " | " | 3.0 | " |
| | c | " | " | " | 1.5 | TiCN: 12 μm |
| | d | WC—10% TiC—10% TaC—32% Co | " | " | 0.9 | TiCN: 5 μm |
| | e | WC—10% TiC—10% TaC—1% Co | " | " | 0.9 | " |
| | f | WC—10% TiC—10% TaC—5% Co | Ion plating process* | " | 0.9 | " |
| | g | " | " | 250° C. | 0.9 | " |
| | h | " | " | 850° C. | 0.9 | " |

*The layer of vapor deposited titanium was exposed to the atmosphere, and then the layer of titanium compound was formed thereon.

TABLE 3

| Kind of coated blade member | | Results of coating separation test | Results of turning test (Time of cutting) (min.) |
|---|---|---|---|
| Blade members of this invention | a | no separation developed | 100 |
| | b | no separation developed | 120 |
| | c | no separation developed | 120 |
| | d | no separation developed | 110 |
| | e | no separation developed | 110 |
| | f | no separation developed | 120 |
| | g | no separation developed | 150 |
| | g' | no separation developed | 170 |
| | g" | no separation developed | 200 |

TABLE 3-continued

| Kind of coated blade member | | Results of coating separation test | Results of turning test (Time of cutting) (min.) |
|---|---|---|---|
| | g''' | no separation developed | 100 |
| | h | no separation developed | 110 |
| | i | no separation developed | 90 |
| | j | no separation developed | 120 |
| | k | no separation developed | 100 |
| | l | no separation developed | 100 |
| Comparison blade members | a | substantial separation developed | 30 |
| | b | no separation developed | 20 |
| | c | no separation developed | chipping developed in ten minutes |
| | d | separation developed | 20 |
| | e | separation developed | 35 |
| | f | separation developed | 30 |
| | g | separation developed | 30 |
| | h | separation developed | 30 |

As shown in Table 3, the comparison blade member (a) had no layer of titanium in the coating and hence exhibited a poor bonding strength of the coating. The comparison blade member (b) had the layer of titanium which was too thick, so that the overall coating became soft to exhibit a poor wear resistance. The comparison blade member (c) had the layer of titanium compound which was too thick, so that the coating became brittle, thereby giving rise to chipping in the blade member. The compariosn blade member (d) had the substrate which contained too much Co, so that the coating was subjected to separation from the substrate. The comparison blade member (e) had the substrate which contained an excessively small proportion of Co, so that the coating was also subjected to separation from the substrate. As described above, the comparison blade member (f) had the coating composed of the titanium layer and the layer of titanium compound which were not successively formed in the same deposition chamber. More specificallly, the layer of vapor deposited titanium was exposed to the atmosphere, and then the layer of titanium compound was formed thereon. This comparison blade member (f) was subjected to separation of the coating from the substrate. The comparison blade members (g) and (h) were also subjected to separation of the coating. The cutting time of each of these comparison blade members was short while the cutting time of each of the blade members of this invention was substantially longer. Further, the thinner the titanium layer was, the higher wear resistance the blade members of this invention exhibited. This is clearly seen from the data of the blade members (g) to (g''') in Table 3. Particularly the blade members, having the titanium layer thickness not exceeding 0.9 μm, exhibited a marked wear resistance.

What is claimed is:

1. In a surface-coated blade member for cutting tools which comprises:
a substrate, and
a coating on at least one surface of said substrate, said coating being composed of (1) a layer of vapor deposited titanium metal on the surface of said substrate, and (2) at least one layer of vapor deposited titanium compound on said layer of titanium metal,
said layer of titanium compound being selected from the group consisting of titanium carbide, titanium nitride, titanium carbo-nitride, titanium oxy-carbide and titanium oxy-carbo-nitride,
said layer of titanium metal being no larger than 2 μm thick and said layer of titanium compound being from 0.5 to 10 μm thick,
the improvement wherein said substrate is a cemented carbide containing 2 to 30% by weight of at least one metal selected from the iron family, and a major proportion of at least one compound selected from the group consisting of carbides, nitrides and carbo-nitrides of metals in Groups $IV_A$, $V_A$ and $VI_A$ of the Periodic Table
said surface-coated blade member produced by the process comprising the steps of:
(a) placing a cemented carbide substrate in a vacuum chamber;
(b) vapor depositing a layer of titanium metal no larger than 2 μm thick on at least one surface of said substrate; and
(c) subsequently vapor depositing at least one layer of titanium compound on said layer of titanium metal to form a coating on said substrate, said layer of titanium compound being 0.5 to 10 μm thick, and said titanium compound being selected from the group consisting of titanium carbide, titanium nitride, titanium carbo-nitride, titanium oxy-carbide and titanium oxy-carbo-nitride;
provided that during steps (b) and (c) said substrate is maintained at a temperature between about 700° C. to 800° C.

2. A surface-coated blade member for cutting tools which comprises:
a substrate of cemented carbide, and
a coating on at least one surface of said substrate, said coating being composed of:
a layer of vapor deposited titanium metal on the surface of said substrate, and
at least one layer of vapor deposited titanium compound on said layer of titanium, said layer of titanium compound being selected from the group consisting of titanium carbide, titanium nitride, titanium carbo-nitride, titanium oxy-carbide,
said layer of titanium metal being no larger than 0.9 μm thick and said layer of titanium compound being 0.5 to 10 μm thick, thereby imparting maximum wear resistance to said coating,
the improvement wherein said substrate is a super hard metal alloy containing 1 to 30% by weight of at least one metal selected from the iron family, and a major proportion of at least one compound selected from the group consisting of carbides, nitrides and carbo-nitrides of metals in Groups $IV_A$, $V_A$ and $VI_A$ of the Periodic Table in which said substrate was maintained at temperatures between 700° C. and 800° C. during the vapor deposition of the titanium metal layer and the titanium compound layer.

3. A blade member according to claim 2, wherein the vapor deposited titanium metal layer is from 0.3 up to 0.9 μm in thickness.

4. A blade member according to claim 2, wherein the vapor deposited titanium metal layer is from about 0.3 up to no greater than 0.7 μm in thickness.

5. In a process for producing a surface-coated blade member for cutting tools, which process comprises the steps of:
 (a) placing a substrate in a vacuum chamber;
 (b) vapor depositing no larger than 0.9 μm thick layer of titanium metal on at least on surface of said substrate; and
 (c) subsequently vapor depositing at least one layer of titanium compound onto said layer of titanium to form a coating on said substrate, said layer of titanium compound being 0.5 to 10 μm thick thereby imparting maximum wear resistance to said coating, and said titanium compound being selected from the group consisting of titanium carbide, titanium nitride, titanium carbo-nitride, titanium oxy-carbide and titanium oxy-carbo-nitride, the improvement wherein
 (1) said substrate is a cemented carbide containing 2 to 30% by weight of at least one metal selected from the iron family, and a major proportion of at least one compound selected from the group consisting of carbides, nitrides and carbo-nitrides of metals in Groups $IV_A$, $V_A$ and $VI_A$ of the Periodic Table, and wherein
 (2) said substrate is maintained at temperatures between about 700° C. and 800° C. during the vapor deposition.

6. A process according to claim 5, wherein the vapor deposited titanium metal is from about 0.3 up to no greater than 0.7 μm in thickness.

* * * * *

UNITED STATES PATENT AND TRADEMARK OFFICE
CERTIFICATE OF CORRECTION

PATENT NO. : 4,450,205
DATED : May 22, 1984
INVENTOR(S) : ITABA et al

It is certified that error appears in the above—identified patent and that said Letters Patent is hereby corrected as shown below:

On the cover page, item [75], delete "Takeshi Abe" as a co-inventor.

Signed and Sealed this

Twenty-third Day of October 1984

[SEAL]

Attest:

GERALD J. MOSSINGHOFF

Attesting Officer     Commissioner of Patents and Trademarks